United States Patent [19]
Lee

[11] 3,993,968
[45] Nov. 23, 1976

[54] SINGLE AMPLIFIER NETWORK FOR SIMULATING AN INDUCTOR

[75] Inventor: Man Shek Lee, Belmont, Calif.

[73] Assignee: GTE Automatic Electric Laboratories Incorporated, Northlake, Ill.

[22] Filed: Dec. 24, 1975

[21] Appl. No.: 644,283

[52] U.S. Cl. .......................... 333/80 R; 333/80 T
[51] Int. Cl.[2] ......................................... H03H 7/44
[58] Field of Search ....................... 333/80 R, 80 T

[56] References Cited
UNITED STATES PATENTS

| | | | |
|---|---|---|---|
| 2,968,773 | 1/1961 | Sandberg | 333/80 T |
| 3,219,952 | 11/1965 | Saraga | 333/80 R |
| 3,831,117 | 8/1974 | Fletcher | 333/80 R |
| 3,895,309 | 7/1975 | Rollett et al. | 333/80 R |

*Primary Examiner*—Harold A. Dixon
*Attorney, Agent, or Firm*—Russell A. Cannon; Leonard R. Cool

[57] ABSTRACT

The one-port network here includes a pair of terminals and a single differential input operational amplifier having an output electrically connected through a resistor R3 to a first input of the amplifier, through a resistor R4 to a second input of the amplifier, through a resistor R7 to one terminal of the network, and through the series combination of the resistor R3 and a resistor R5 to the other terminal of the network which is also electrically connected to a ground reference potential. The second input of the amplifier is also connected to ground through a resistor r6. The first and second inputs of the amplifier are also electrically connected through the series combination of a resistor R1 and capacitor C1 and through a resistor R2, respectively, to the one network terminal. With the initial constraint that the conductance $g7$ of the resistor R7 satisfies the relationship $$g7 = \frac{(g1 + g2)(g3g6 - g4g5)}{g5(g2 + g4) - g6(g1 + g3)},$$

where $g$ corresponds to the conductance of an associated resistor, the impedance presented across the network terminals corresponds to that of the series combination of an inductor and a resistor. Proper selection of element values produces an impedance across the network terminals which corresponds to a single inductor, a single resistor, or an inductor in series combination with a resistor of which the simulated element values may be positive or negative.

13 Claims, 2 Drawing Figures

SINGLE AMPLIFIER NETWORK FOR SIMULATING AN INDUCTOR

BACKGROUND OF INVENTION

This invention relates to simulation networks and more particularly to a network for simulating an inductor or resistor alone or connected in series.

In order to provide high-quality filters for use in integrated circuit applications, simulation procedures are employed to replace filter inductors with other elements than can be fabricated with integrated circuit techniques. Prior-art publications describe various networks for producing simulated inductors. In many instances, this is accomplished with a gyrator and a capacitor. The article "High-Quality Transistorized Gyrator" by D. F. Sheahan and H. J. Orchard, Electronics Letters, 1966, pp. 274 – 275, realizes a gyrator in terms of current generators. The article "Simulated Inductors Using Differential Amplifiers" by R. H. S. Riordan, Electronic Letters, February 1967, vol. 3, no. 2, pp. 50 – 51, describes a simulation circuit based on differential amplifiers since they are generally easier to realize than current generators. Although the Riordan circuit may be employed to produce both grounded and floating inductors, this circuit requires at least a pair of differential amplifiers as does the high-Q circuit in the article, "Active Filters and Oscillators Using Simulated Inductance" by R. L. Ford & F. E. J. Girling, Electronic Letters, February 1966, vol. 2, no. 2, p. 52. The article, "Loss-Compensated Active Gyrator Using Differential-Input Operational Amplifiers" by A. J. Prescott, Electronic Letters, July 1966, vol. 2, no. 7, pp. 283 – 284 discloses a circuit for simulating an ideal inductor with a single differential amplifier and a negative resistor, the latter also requiring an amplifier for simulation. Therefore two amplifiers are needed for Prescotts inductor simulation circuit.

An object of this invention is the provision of an improved network that uses a single amplifier, a single capacitor and positive resistors for simulating a grounded inductor and a resistor singularly or connected in series.

DESCRIPTION OF DRAWING

This invention will be more fully understood from the following detailed descriptions of preferred embodiments thereof, reference being had to the drawing in which.

DESCRIPTION OF PREFERRED EMBODIMENTS

Figure 1:
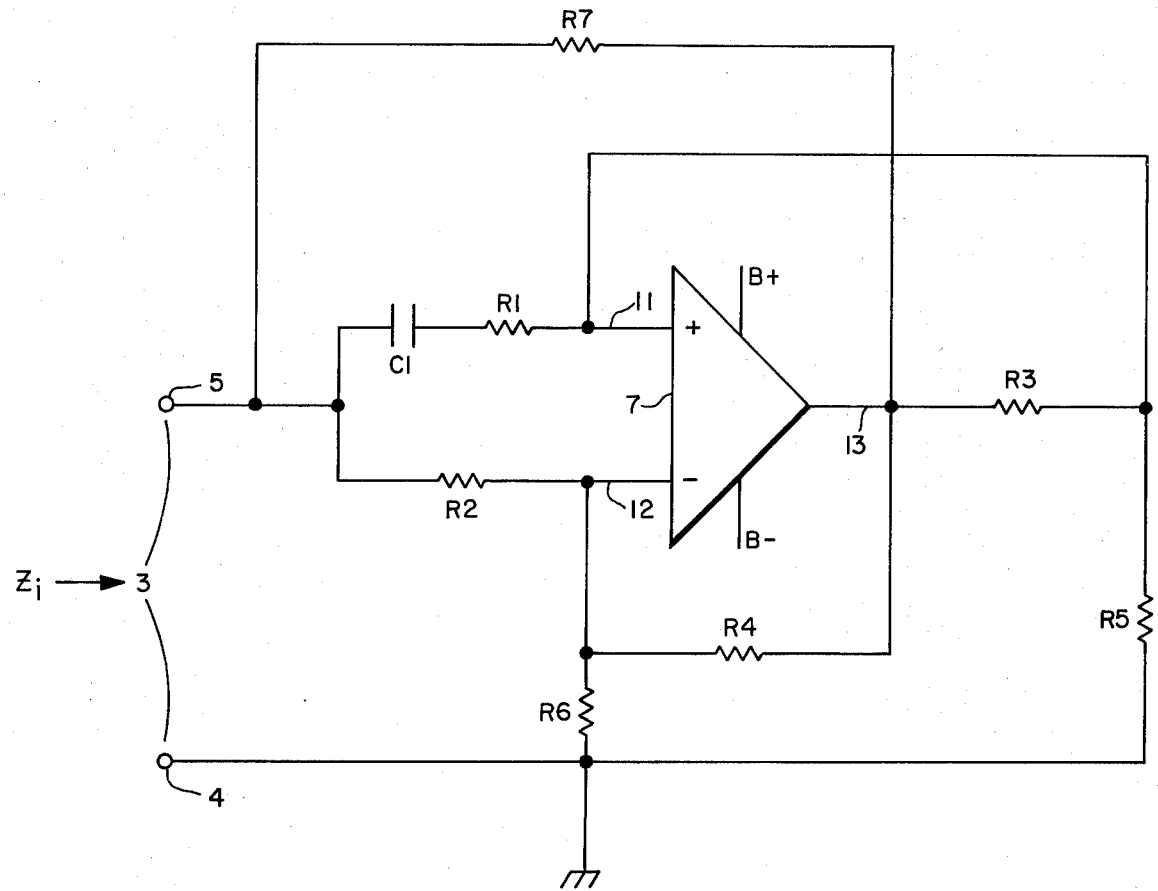
FIG. 1 is a schematic circuit diagram of a simulation network embodying this invention.
Figure 2:
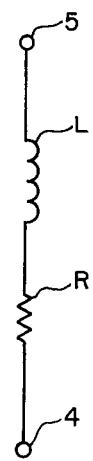
FIG. 2 is a schematic representation of the circuit elements simulated by the network in FIG. 1 across the one port thereof.

The network in FIG. 1 comprises a single port 3 including a pair of terminals 4 and 5, a single amplifier 7, a single capacitor C1, and a plurality of resistors R1 – R7, inclusive. The same reference characters (e.g., R5) are employed in this description to designate both the element itself and the element value (e.g., the resistance thereof). The context in which a reference character is employed clearly indicates what is being designated thereby.

The amplifier 7 is a differential-input operational amplifier. This amplifier 7 is considered in the following description to be an ideal amplifier with zero output impedance, infinite input impedance, and infinite voltage gain. Although such an ideal amplifier does not exist in practice, this does not seriously affect the design of the illustrated network. A non-ideal amplifier 7 merely introduces extraneous terms in the impedance $Z_i$ simulated across the network terminals 4 and 5 which can be compensated for, in a manner well known in the art, in order to produce the desired impedance $Z_i$ across port 3.

One network terminal 4 is connected to a ground reference potential. Terminals of the amplifier are also connected to a power supply voltage in a manner well known in the art. The other network terminal 5 is electrically connected through the series combination of capacitor C1 and resistor R1 and through the resistor R2 to the input lines 11 and 12, respectively, to amplifier 7. The lines 11 and 12 are preferably connected to the positive and negative inputs, respectively, of the amplifier 7. These connections may be reversed in most instances, however, and the network will still operate satisfactorily. The actual polarity of the amplifier connections is selected to ensure that the network is DC stable. This is accomplished by making the negative feedback here greater than the positive feedback in a manner well known in the art. This connection may also be affected by whatever resistance path is connected across the terminals 4 and 5. The output line 13 of the amplifier is electrically connected through resistor R3 to the input line 11, through resistor R4 to the other input line 12, and through the series combination of resistors R3 and R5 to the network terminal 4. The input line 12 is connected through resistor R6 to network terminal 4 and ground. The output line 13 of the amplifier is also connected through a resistor R7 to the network terminal 5.

Consider that the values of the capacitance and resistance of network elements are normalized and expressed in farads and ohms, respectively. Solving the node equations for this network, and requiring that the resistances of elements here satisfy the relationship $$g7 = \frac{(g1 + g2)(g3g6 - g4g5)}{g5(g2 + g4) - g6(g1 + g3)}, \quad (1)$$

where $g$ represents the conductance of an associated resistor, the impedance $Z_i$ looking into port 3 is representable as $$Z_i sL + R = s(n1/do) + no/do \quad (2)$$

where the constants $n1$, $n0$, and $d0$ are defined as follows:

$$do = g1(g2(g4\ g5 - g3\ g6) + g7(g5(g2 + g4) - g3\ g6)) \quad (3)$$

$$no = g1(g4\ g5 - g3(g2 + g6)) \quad (4)$$

$$n1 = C1(g4(g1 + g5) - g3(g2 + g6)). \quad (5)$$

This impedance $Z_i$ corresponds to the series combination of a resistor $R$ and an inductor $L$ between the network terminals 4 and 5. By suitable selection of values of the network elements, either a resistor or an inductor alone or an inductor in series with a resistor may be simulated across port 3. Also, the values of either one or both of the simulated elements may be positive or negative.

The simulated resistor R has a positive resistance when the values of network elements satisfy equation (1) and the additional requirement that $$R = (no/do) > 0 \qquad (6)$$

This occurs when the values of no and do are both positive and are both negative. Conversely, a frequency-independent negative resistance R is simulated where the values of network elements satisfy equation (1) and the additional requirement that $$R = no/do < 0. \qquad (7)$$

This occurs when no and do are of opposite sign.

The simulated inductor L has a positive inductance when the values of network elements satisfy equation (1) and the additional requirement that $$L = (n1/do) > 0. \qquad (8)$$

This occurs when the values of n1 and do are both positive or are both negative. Conversely, the simulated inductor L has a negative inductance where the values of network elements satisfy equation (1) and the requirement that $$L = (n1/do) < 0. \qquad (9)$$

This latter condition is satisfied when the values of n1 and do are of opposite sign.

Finally, the network simulates a resistor R alone across port 3 when C1 = 0. The simulated resistance R is negative and frequency independent when element values also satisfy equation (7), i.e., $R = (no/do) < 0$. One set of element values that satisfies equation (7) is $$g2 = g3 = g4 = g5 = g6 = g7 = 1/R > 0, \qquad (10)$$

the simulated resistance R here now being negative.

The network simulates an inductor alone across the port 3 when the values of network elements satisfy equation (1) and the additional requirements that $$R = no/do = 0, n1/do \neq 0, g1 \neq 0. \qquad (11)$$

This occurs when the element values satisfy equation (1) and the relationship $$g4\, g5 = g3(g2 + g6). \qquad (12)$$

This simulated inductance is positive or negative when element values satisfy equations (8) or (9), respectively.

The value of do is positive and negative for element values satisfying various relationships, e.g., $$g2(g4\, g5 - g3\, g6) + g7\, g5(g2 + g4) > g7\, g3\, g6 \qquad (13)$$

and $$g2(g4\, g5 - g3\, g6) + g7\, g5\, (g2 + g4) < g7\, g3\, g6, \qquad (14)$$

respectively, where the value of g1 is positive, non-zero and not equal to infinity. The value of no is positive and negative for element values satisfying the relationships $$g4\, g5 > g3(g2 + g6) \qquad (15)$$

and $$g4\, g5 < g3(g2 + g6) \qquad (16)$$

respectively, where the value of g1 is positive, non-zero, and not equal to infinity. Finally, the value of n1 is positive and negative for element values satisfying the relationships $$g4(g1 + g5) > g3(g2 + g6) \qquad (17)$$

and $$g4(g1 + g5) < g3(g2 + g6), \qquad (18)$$

respectively, where the value of C1 is positive and non-zero.

In order to simulate the series combination of a particular resistor R and inductor L across port 3, the value of either being zero, values of network elements are selected to satisfy the requirements in equation (1) and of R and L in equations (2) – (5). In practice, desired values of the simulated inductor L and resistor R are selected. Normalized values of the network elements are also selected so as to satisfy equations (1) – (5) for the previously selected values of L and R. Finally, the normalized values of the network elements are denormalized to values for corresponding elements which are physically realizable in an actual circuit. By way of example, the series combination of an inductor L and a resistor having a negative resistance is simulated across port 3 if values of network elements satisfy the definitions:

$$Z_i = sL - R, \text{ for } L > 0, R > 0$$

$$g2 = g4 = g5 = g6 = g7 = 1/6R,$$

$$g1 = 1/3R$$

$$g3 = 1/8R,$$

and $$C1 = L/18R^2.$$

In an alternate embodiment of the invention, the network simulates a positive inductance alone across port 3 where $$Z_i = sL \text{ for } L > 0$$

$$g1 = g2 = g3 = 1$$

$$g4 = g7 = 2g1$$

$$g5 = 3g1$$

$$g6 = 5g1$$

and $$C1 = 9L(g)^2.$$

What is claimed is:

1. An active, one-port simulation network for simulating an inductor and a resistor, electrically connected in series across the pair of terminals of the network port, comprising:
   a differential-input operational amplifier having first and second input lines electrically connected to associated input terminals of the amplifier which are of opposite polarity and having an output line;
   a resistor R1 and capacitor C1 electrically connected in series between one network terminal and said first input line;
   a resistor R2 electrically connected between the one terminal and said second input line;

a resistor R3 electrically connected between said output line and said first input line;

a resistor R4 electrically connected between said output line and said second input line;

a resistor R5 electrically connected between said first line and the other network terminal, which is connected to a ground reference potential;

a resistor R6 electrically connected between said second input line and ground;

a resistor R7 electrically connected between said output line and the one network terminal;

normalized values of the capacitance of said capacitors and the resistance of said resistors and the simulated elements satisfying the requirements that $$g7 = \frac{(g1+g2)(g3g6-g4g5)}{g5(g2+g4)-g6(g1+g3)},$$

where $g$ represents the conductance of a particular one of said resistors, the impedance $Z_i$ looking into the network port satisfying the relationships $$Z_i = sL + R$$

where $L = n1/d0, R = n0/d0$ and $d0 = g1(g2(g4\ q5 - g3\ g6) + g7(g5(g2 + g4) - g3\ g6))$ $n0 = g1(g4\ g5 - g3(g2 + g6))$ $n1 = C1(g4(g1 + g5) - g3(g2 + g6)).$ 2. The simulation network according to claim 1 including only a single amplifier.

3. The simulation network according to claim 2 wherein the values of said resistors and capacitors satisfy the requirement that $(n0/d0) < 0$, the network now simulating an inductor and a resistor having a frequency-independent negative resistance in series across the network port.

4. The simulation network according to claim 3 wherein $n0$ and $d0$ are of opposite sign.

5. The simulation network according to claim 2 wherein the values of said resistors and capacitors satisfy the requirements that $(n0/d0) < 0$ and that the value of the capacitance of said capacitor C1 is equal to zero, the network now simulating a resistor alone having a frequency-independent negative resistance across the network port.

6. The simulation network according to claim 2 wherein the values of said resistors and capacitors satisfy the requirements that $n0 = 0$, the network now simulating an inductor alone across the network port.

7. The simulation network according to claim 6 wherein $g4\ g5 = g3(g2 + g6)$.

8. The simulation network according to claim 2 wherein $(n1/d0) > 0$, the simulated inductance being positive.

9. The simulation network according to claim 2 wherein $(n1/d0) < 0$, the simulated inductance being negative.

10. The simulation network according to claim 9 wherein $n1$ and $d0$ are of opposite signs.

11. The simulation network according to claim 2 wherein the values of said resistors and capacitors satisfy the requirements that $(n0/d0) < 0$ and $n1 = 0$, the network now simulating a resistor alone having a frequency-independent negative resistance across the network port.

12. The simulation network according to claim 11 where the value of the capacitance of said capacitor C1 is zero.

13. The simulation network according to claim 11 where the values of said resistors and capacitors satisfy the requirement that $g4(g1 + g5) = g3(g2 + g6)$.

* * * * *

UNITED STATES PATENT AND TRADEMARK OFFICE
CERTIFICATE OF CORRECTION

PATENT NO. : 3,993,968

DATED : November 23, 1976

INVENTOR(S) : Man Shek Lee

It is certified that error appears in the above-identified patent and that said Letters Patent are hereby corrected as shown below:

In line 11 of the Abstract, change "r6" to -- R6 --.

Column 4, line 54, change "$C1 = 9L(g)^2$" to -- $C1 = \frac{9L(g1)^2}{2}$ --.

Column 5, line 29, claim 1, change "q5" to -- g5 --.

Signed and Sealed this

Tenth Day of May 1977

[SEAL]

Attest:

RUTH C. MASON
Attesting Officer

C. MARSHALL DANN
Commissioner of Patents and Trademarks